United States Patent [19]

Blalock et al.

[11] Patent Number: 5,252,517
[45] Date of Patent: Oct. 12, 1993

[54] METHOD OF CONDUCTOR ISOLATION FROM A CONDUCTIVE CONTACT PLUG

[75] Inventors: Guy T. Blalock; David S. Becker, both of Boise, Id.

[73] Assignee: Micron Semiconductor, Inc., Boise, Id.

[21] Appl. No.: 988,626

[22] Filed: Dec. 10, 1992

[51] Int. Cl.⁵ .............................................. H01L 21/28
[52] U.S. Cl. .................................. 437/195; 437/189; 437/190; 148/DIG. 50; 156/649; 156/651
[58] Field of Search ...................... 437/189, 195, 190; 148/DIG. 50; 156/649, 651

[56] References Cited

U.S. PATENT DOCUMENTS

| | | | |
|---|---|---|---|
| 4,685,197 | 8/1987 | Tigelaar et al. | 437/195 |
| 4,900,695 | 2/1990 | Takahashi et al. | 437/195 |
| 5,010,039 | 4/1991 | Ku et al. | 437/195 |
| 5,114,879 | 5/1992 | Madan | 437/195 |
| 5,198,387 | 3/1993 | Tang | 437/233 |
| 5,204,286 | 4/1993 | Doan | 148/DIG. 50 |

*Primary Examiner*—Brian E. Hearn
*Assistant Examiner*—Laura M. Holtzman
*Attorney, Agent, or Firm*—David J. Paul

[57] ABSTRACT

The method of the present invention introduces a fabrication method for providing capacitor cell polysilicon isolation from a polysilicon contact plug in a semiconductor fabrication process, by providing a contact opening through a first insulating layer, the cell polysilicon layer, and a second insulating layer, thereby exposing patterned edges of the cell polysilicon and providing access to an underlying diffusion area. The contact opening is then filled with a conductively doped polysilicon and an upper portion the polysilicon filler is removed until its top surface is recessed below the bottom surface of the cell polysilicon. Next, the cell polysilicon's patterned edges and the top of the first conductive material are oxidized which is followed by an anisotropic etch to remove the oxide only from the top of the polysilicon filler while retaining a major portion of the oxide on the cell polysilicon's patterned edges. Finally, the contact opening is refilled with conductively doped polysilicon.

21 Claims, 6 Drawing Sheets

METHOD OF CONDUCTOR ISOLATION FROM A CONDUCTIVE CONTACT PLUG

FIELD OF THE INVENTION

This invention relates generally to semiconductor fabrication and in particular to a fabrication method which provides capacitor cell polysilicon isolation from a polysilicon contact plug.

BACKGROUND OF THE INVENTION

As semiconductor devices become more and more dense, it has become necessary to use multiple conductive layers in order to successfully manufacture these dense devices while retaining relatively small package sizes. This is particularly true with dynamic random access memories as memory density has increased while the space allowed for each storage capacitor has decreased. Due to the need to save die space while maintaining capacitance, approaches have been taken to save space by insulating the capacitor's electrode (normally polysilicon and referred to hereinafter as cell poly) from a contact forming filler (referred to hereinafter as a contact plug or poly plug).

A conventional method to accomplish isolation of a cell poly from the contact plug requires the use of a contact filler definition pattern and poly etch. The pattern would be applied to the cell poly layer and then dry etched in order to form windows in the cell poly thus allowing for the contact placement. This method has the disadvantage of requiring enough sizing to insure that no connection could be made from the contact plug to the cell poly. Given the current state of lithographic technology, for example, this would require 0.15 μ of spacing from each side of the window to the contact filler. This would result in the final sizing of the die to be increased by 0.3 μ per DRAM cell location.

The method proposed, herein, uses a penetrating cell plate contact technology to recapture the 0.3 μ of space consumed by the old technology. This method is achieved by not patterning the cell poly until the actual contact is being etched. The contact etch must etch, not only down to, but also through the cell poly, (anisotropically or isotropically depending on the application) and finally etching down to the substrate to finish the contact etch. Before the contact plug can be applied to the contact opening, the cell poly must be electrically isolated so that it is not possible for a conduction path to be present between the cell poly and the substrate.

A couple of such methods have been studied for cell poly isolation from a poly plug. One method involves oxidizing the cell poly with a wet oxidation step with the results depicted in FIG. 1. As FIG. 1 shows, the silicon 11 at the bottom of the contact will oxidize much faster than the cell poly 12. This results in having a thick oxide layer 13 to etch out of the bottom of the contact after the oxidation is complete. Using either a selective etch or stopping the etch short of clearing the silicon from oxide will leave behind a thick layer of oxide 13 in the bottom of the contact area, which is an undesirable side effect.

A second method uses a nitride deposition to insulate the cell poly from the poly plug as depicted in FIG. 2. This method results in the same problem as the oxidation method in that now a presence of thick nitride 21 residing in the contact area must be removed.

Unfortunately, both methods listed above increase the defect density problem due to the fact that a contact must be etched twice which doubles the chance of particles, generated from the etch chamber(s), to block the etch.

Another problem associated with double etching of the contacts is that during the second etch no photoresist is present. The presence of photoresist increases the carbon content of the plasma which improves the selectivity of the etch locally to the substrate and to the contact alignment spacers. This lack of local selectivity could cause excessive removal of substrate which is very undesirable if a shallow junction exists in this contact area. The loss in selectivity could also open areas of the poly gate and allow for unwanted contact to the poly plugs.

A new approach that provides cell poly isolation from a poly plug is needed that subjects the contact to a single etch is in fact accomplished by the present invention.

SUMMARY OF THE INVENTION

The method of the present invention introduces a fabrication method for providing conductor isolation from a conductive contact plug in a semiconductor fabrication process, with the method comprising the steps of:

providing a contact opening through a first insulating layer, a conductive layer, and a second insulating layer, thereby exposing patterned edges of the conductive layer and providing access to an underlying contactable material;

filling the contact opening with a first conductive material;

removing an upper portion the first conductive material until the top of the first conductive material is recessed below the bottom surface of the conductive layer;

insulating the conductive layer's patterned edges and the top of the first conductive material;

removing the insulation from the top of the first conductive material while retaining a major portion of the insulation on the conductive layer's patterned edges; and refilling the contact opening with a second conductive material.

In the preferred embodiment the conductive layer comprises conductively doped polysilicon, the first and second insulating layers comprise borophosphosilicate glass (BPSG), the first conductive material comprises doped polysilicon and the second conductive material comprises either doped polysilicon or some type of metal or metal silicide. However, as one skilled in the art will recognize, many conductive and insulative materials may be used to practice the invention.

DETAILED DESCRIPTION OF THE PREFERRED EMBODIMENTS

The present invention, as depicted in FIGS. 3-8b, demonstrates process steps integrated into the fabrication of a dynamic random access memory (DRAM) that will provide sufficient isolation between a storage capacitor's cell poly and a contact poly plug. Though, the process described hereinafter, refers to DRAM fabrication, it is meant to serve as an example for practicing the present invention. As one skilled in the art will recognize from the detailed description that follows, the present invention may be integrated into any semiconductor fabrication process that requires contact plug isolation from an intervening conductive layer.

Figure 1:
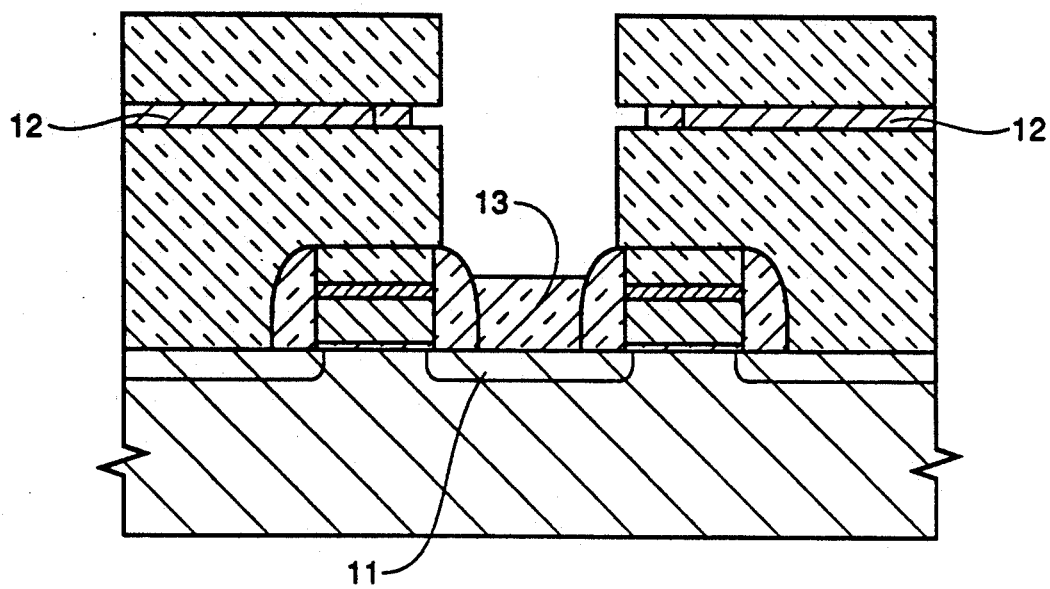
FIG. 1 is a composite cross-sectional view of an in process wafer portion depicting a contact opening through cell poly down to the diffusion area of a substrate which has been subsequently oxidized.
Figure 2:
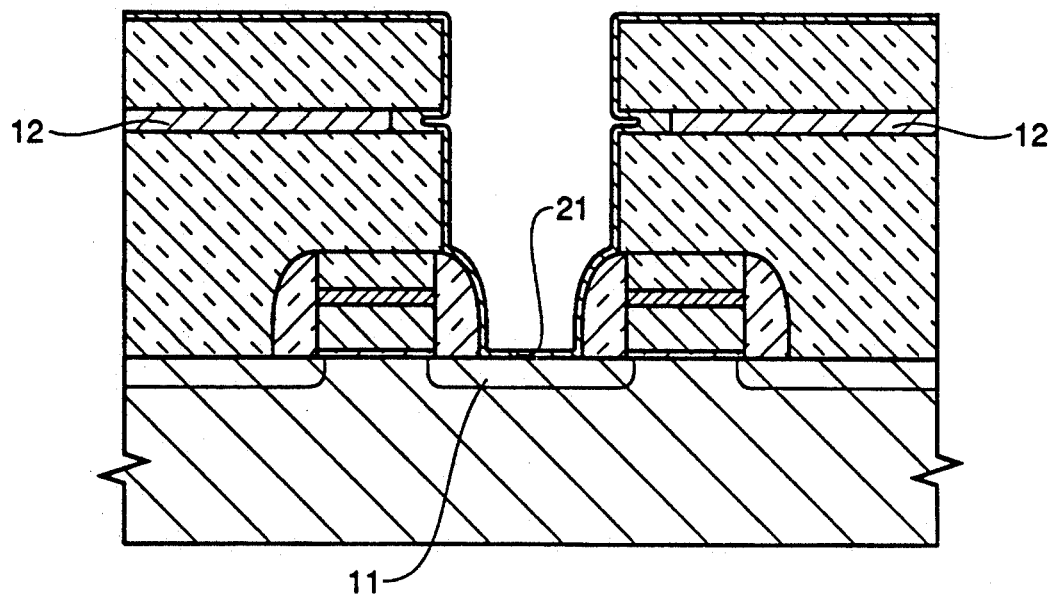
FIG. 2 is a composite cross-sectional view of an in process wafer portion depicting a contact opening through cell poly down to the diffusion area of a substrate followed by nitride deposition.
Figure 3:
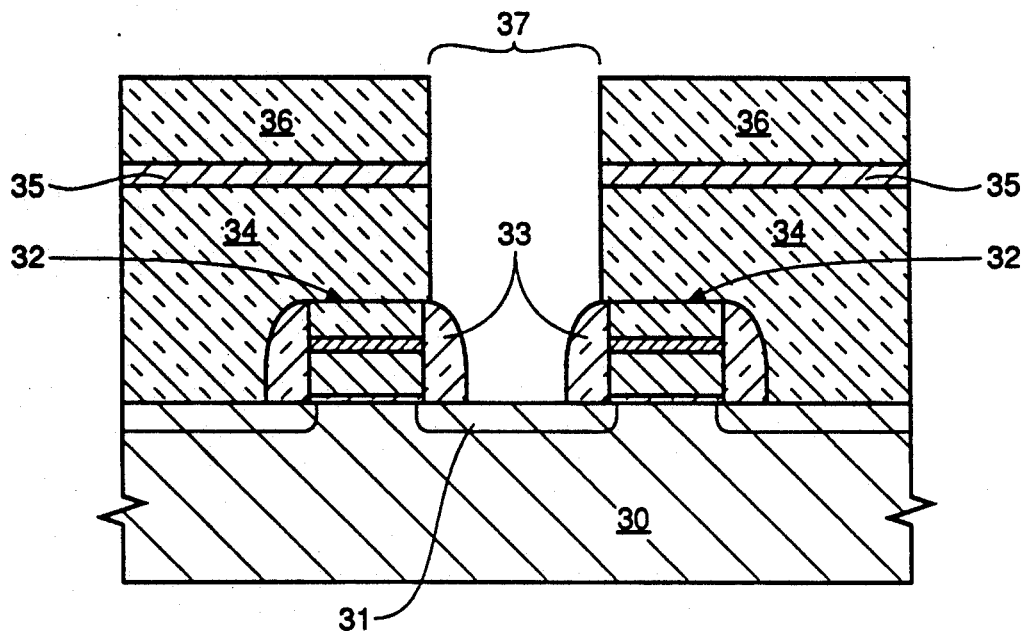
FIG. 3 is a composite cross-sectional view of an in process wafer portion depicting a contact opening through cell poly down to the diffusion area of a substrate, which depicts the starting point for the process steps of the present invention.

Referring now to FIG. 3, a starting substrate 30 has been processes up to the point where diffusion areas 31 (also referred to as active areas 31) are formed into substrate 30 and aligned to conductive word lines 32. Spacers 33 (typically nitride, but could be oxide if alignment is not critical) have been formed about the patterned vertical edges of word lines 32 for isolation purposes. A planarized insulating layer 34 (BPSG in this example) has formed over the existing material residing on substrate 30, followed by deposition of conductive poly layer 35. In this example, poly layer 35 serves as the storage node cell poly in a storage cell of a DRAM array. A second planarized insulating layer 36 (also BPSG in this example) has been formed over poly layer 35. Next, contact opening 37, aligned between adjacent word lines 32, has been anisotropically etched through BPSG layer 36, poly layer 35 and BPSG layer 34, thereby exposing a portion of active area 31.

Figure 4:
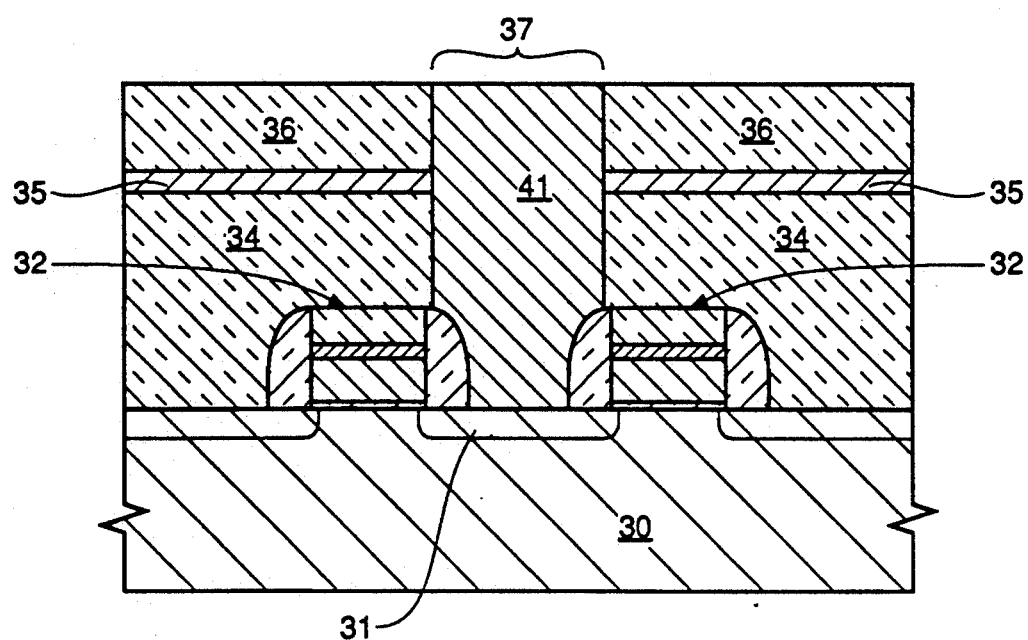
FIG. 4 is a composite cross-sectional view of the in process wafer portion of FIG. 3, following deposition and planarization of a polysilicon filler into the contact opening.

Referring now to FIG. 4, contact opening 37 is filled with a conductive material 41, such as conductively doped poly, that is also planarized down to or near the planar surface of BPSG layer 36 to form a contact filler.

Figure 5:
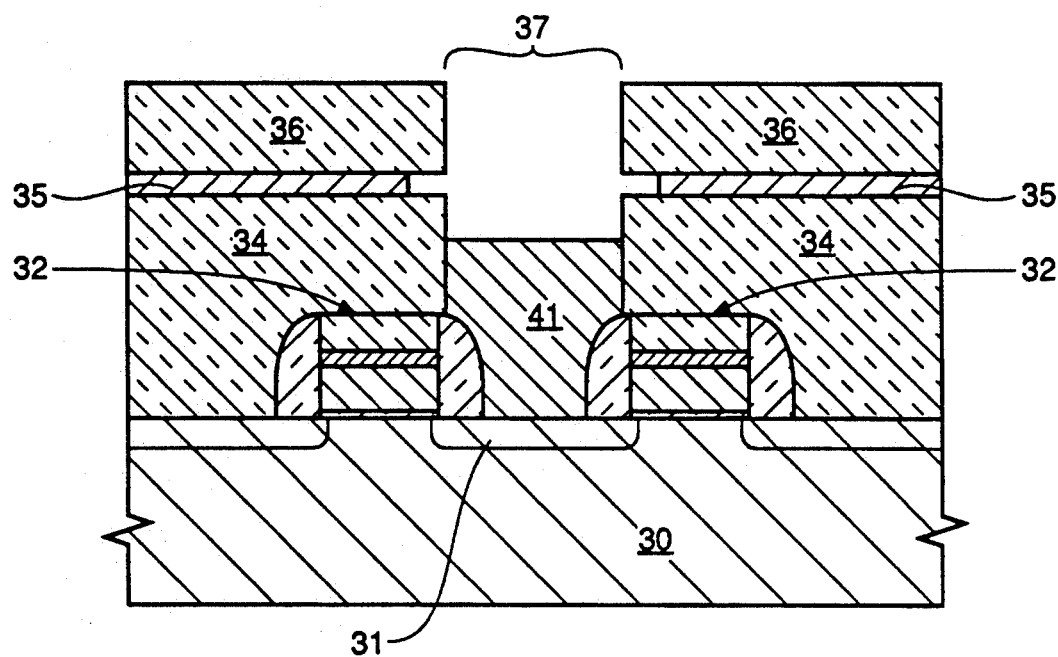
FIG. 5 is a composite cross-sectional view of the in process wafer portion of FIG. 4, following an isotropic etch of the polysilicon filler and the cell poly.

Referring now to FIG. 5, poly contact filler 41 is first, anisotropically etched until its top surface is recessed below cell poly 35 and second, both the poly contact filler 41 and the cell poly 35 are isotropically etched. The isotropic etch recesses the edges of cell poly 35 in between BPSG layers 34 and 36 as well as further recessing cell poly 35. This etch must continue until it is assured that poly contact filler 41 no longer makes physical contact to cell poly 35. If so desired, the anisotropic etch step could be skipped and only the isotropic preformed to accomplish the same results.

Figure 6A:
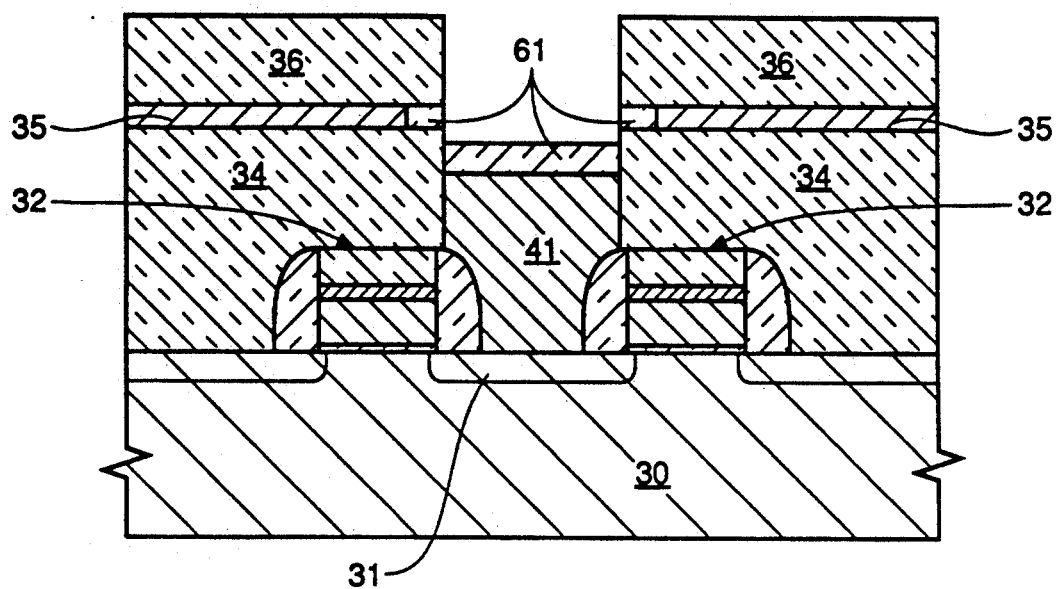
FIGS. 6a and 6b are composite cross-sectional views of the in process wafer portion of FIG. 5, following insulation of the recessed polysilicon filler and the patterned edges of the cell poly.
Figure 6B:
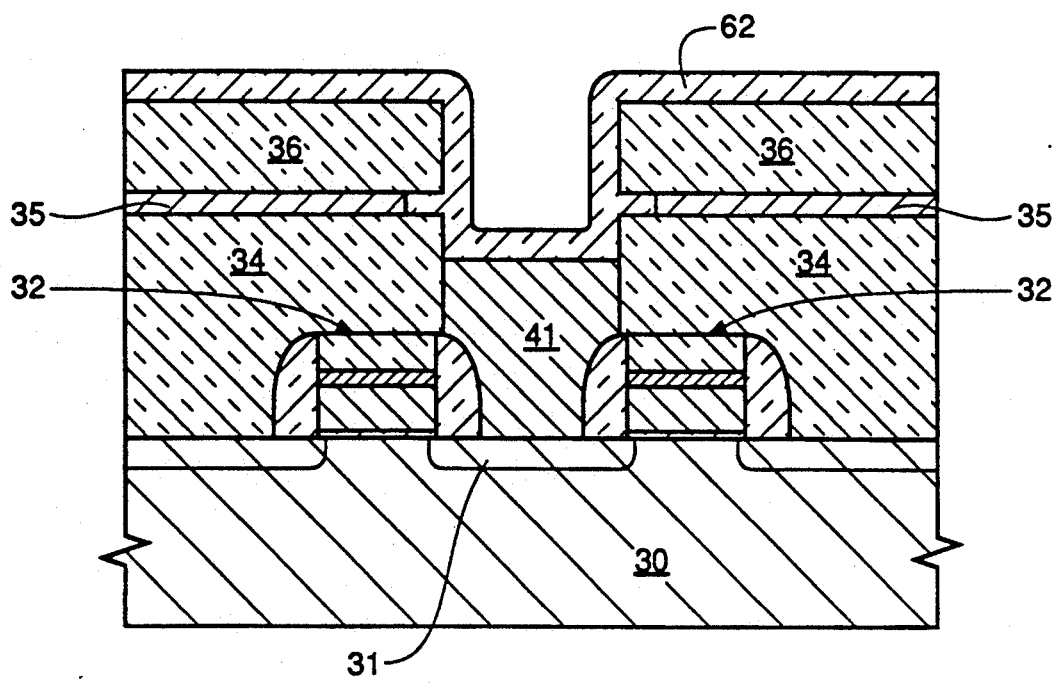

Referring now to FIG. 6a, the upper exposed surface of poly contact filler 41 and the exposed recessed edges of cell poly 35 are subjected to an insulating agent 61, such as oxidation. The insulating agent can also be deposited using plasma or conventional chemical vapor deposition (CVD) methods such as depicted in FIG. 6b. In FIG. 6b, film 62 may be silicon oxide or silicon nitride. The main requirement is that electrical breakdown strength of film 62 and leakage properties of the film are adequate in preventing leakage between the cell poly and cell plug.

Figure 7A:
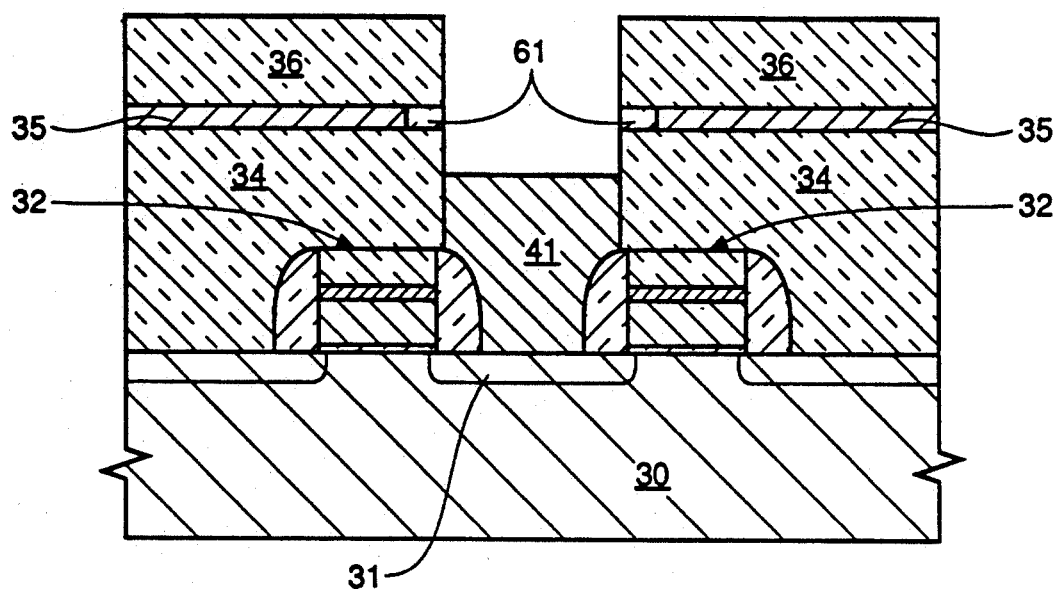
FIGS. 7a and 7b are composite cross-sectional views of the in process wafer portion of FIGS. 6a and 6b respectively, following removal of the insulation from the surface of the polysilicon filler.
Figure 7B:
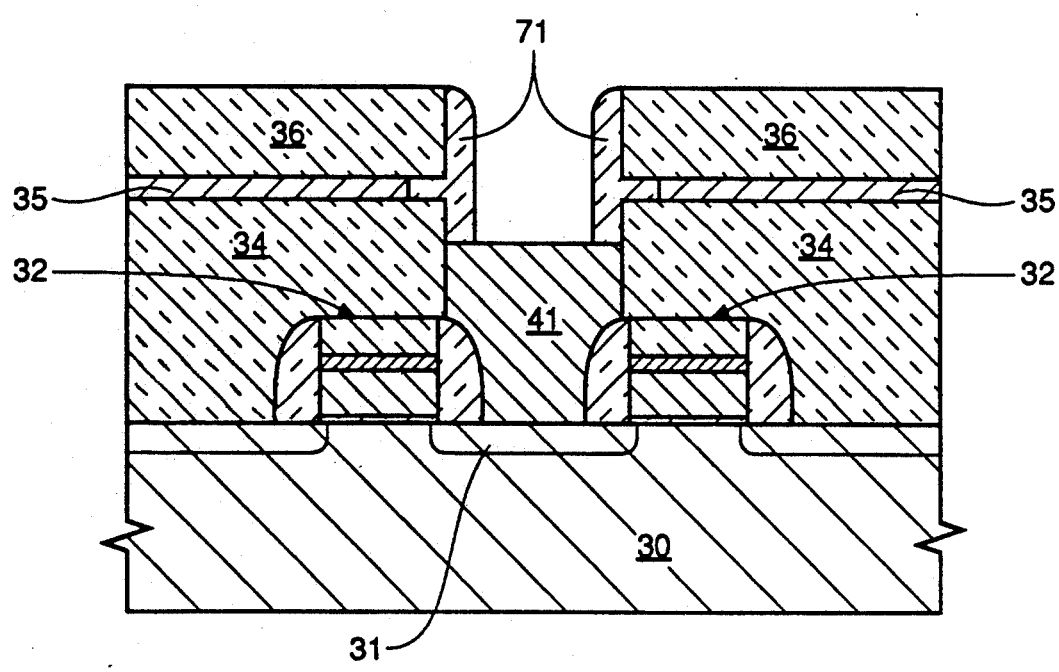

Referring now to FIG. 7a, an anisotropic etch is performed that removes oxide 61 (or nitride, if used) that is residing at the top surface of poly contact filler 41, but at the same time leaves a portion of oxide 61 residing at the recessed edges of cell poly 35 in tact. It this portion of oxide 61 that will eventually provide isolation between cell poly 35 and the completed poly plug which is to be formed next. If a deposited film is used (such as in FIG. 6b), then a spacers 71, covering the sidewalls of BPSG layers 34 and 36 that also seals off the patterned edges of poly 35, will be formed as depicted in FIG. 7b.

Figure 8A:
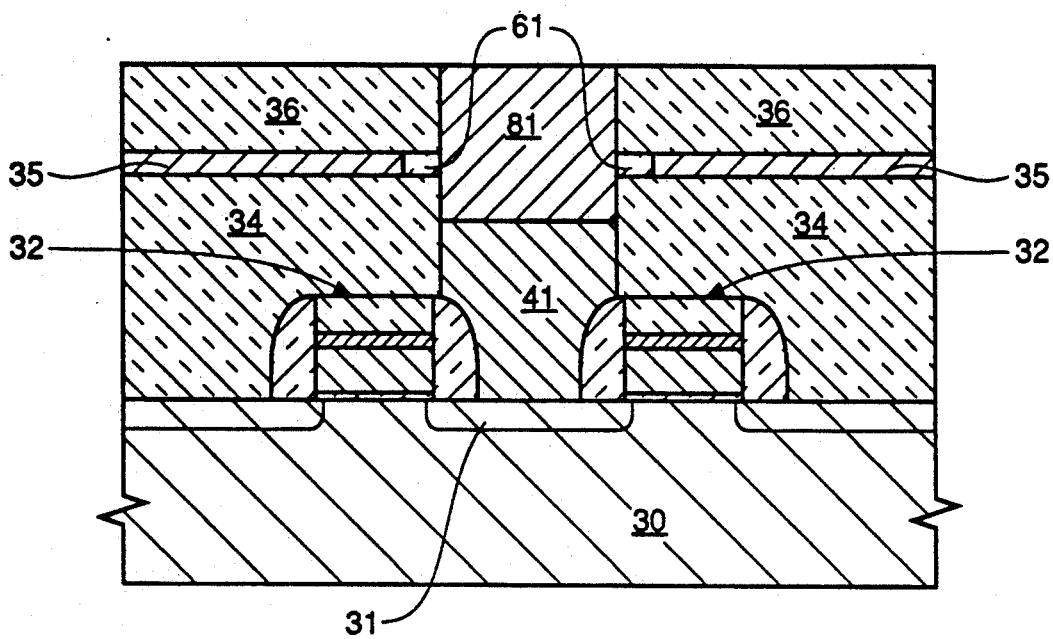
FIGS. 8a and 8b are composite cross-sectional views of the in process wafer portion of FIGS. 7a and 7b respectively, following a polysilicon deposition to refill the remaining contact opening.
Figure 8B:
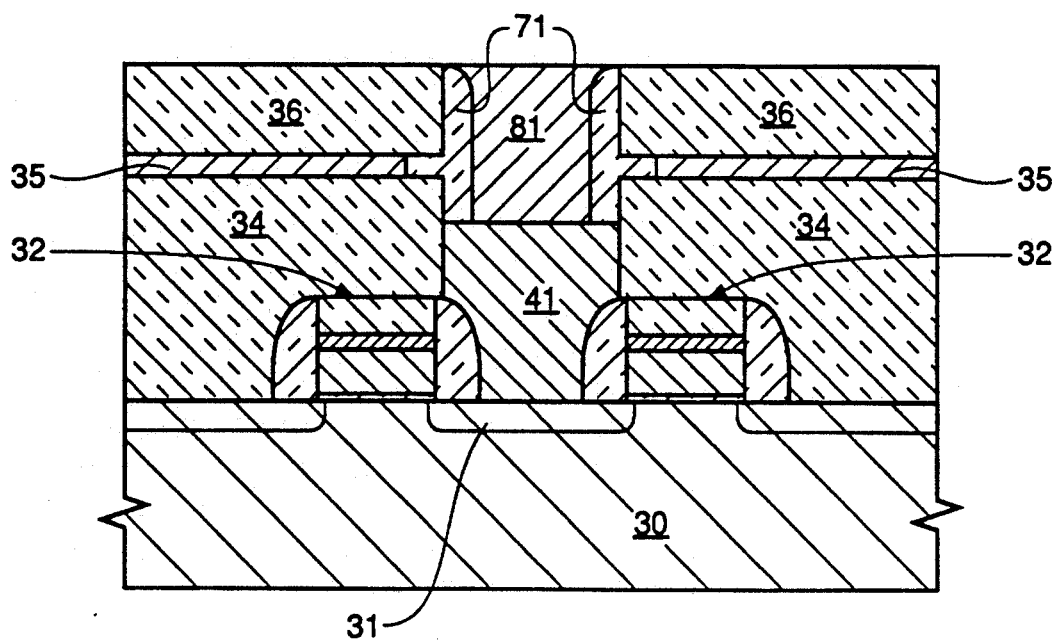

Referring now to FIG. 8b, a second filler of conductive material 81 (preferably conductively doped poly) is formed to refill the remaining void in contact opening 37 and to make contact to underlying poly 41, and thereby forming a completed poly plug 82. Alternately, if the process steps depicted in FIGS. 6b and 7b are followed the resulting contact plug 82 shown in FIG. 8b is formed. In either case the process then continues by conventional methods to complete the DRAM device.

It is to be understood that although the present invention has been described in a preferred embodiment, various modifications known to those skilled in the art may be made without departing from the invention as recited in the several claims appended hereto. For example, the present invention uses oxide and BPSG as insulating layers and conductively doped polysilicon as conductive material, however many insulating agents, such as nitride or oxide/nitride composites may be used as substitutes. Also, other conductive materials, such as metals and metal silicides may be used as substitutes for conductively doped polysilicon.

We claim:

1. A method for providing conductor isolation from a conductive contact plug in a semiconductor fabrication process, said method comprising the steps of:
   a) providing a contact opening through a first insulating layer, a conductive layer, and a second insulating layer, thereby producing contact side walls and exposing patterned edges of said conductive layer and providing access to an underlying contactable material;
   b) filling said contact opening with a first conductive material;
   c) removing an upper portion of said first conductive material and a portion of the edges of said conductive layer, said removing step continues until the top surface of said first conductive material is recessed below the bottom surface of said conductive layer and said conductive layer is recessed in from the contact side walls;
   d) insulating said conductive layer's patterned edges and said top surface of said first conductive material;

e) removing said insulation from the top surface of said first conductive material while retaining a major portion of the insulation on said conductive layer's patterned edges; and f) refilling said contact opening with a second conductive material and forming said conductive contact plug therein.

2. The method as recited in claim 1, wherein said first and second insulating materials comprise borophosilicate glass.

3. The method as recited in claim 1, wherein said conductive layer comprises conductively doped polysilicon.

4. The method as recited in claim 1, wherein said contactable material comprises conductively doped silicon.

5. The method as recited in claim 1, wherein said first conductive material comprises conductively doped polysilicon.

6. The method as recited in claim 1, wherein the removing step as recited in step "c" comprises an isotropic etch.

7. The method as recited in claim 1, wherein the removing step as recited in step "c" comprises an anisotropic etch followed by an isotropic etch.

8. The method as recited in claim 1, wherein said insulating step comprises oxidation.

9. The method as recited in claim 1, wherein said insulating step comprises insulator deposition of a material selected from the group consisting essentially of silicon dioxide and silicon nitride.

10. The method as recited in claim 1, wherein the removing step as recited in step "e" comprises an anisotropic etch.

11. The method as recited in claim 1, wherein said second conductive material comprises conductively doped polysilicon.

12. The method as recited in claim 1, wherein said second conductive material comprises a material selected from the group consisting essentially of metals and metal silicides.

13. A method for providing capacitor storage cell electrode isolation from a conductive contact plug in a semiconductor fabrication process, said method comprising the steps of:

a) providing a contact opening through a first insulating layer, a conductive cell electrode layer, and a second insulating layer, thereby producing contact side walls and exposing patterned edges of said conductive cell electrode layer and providing access to an underlying diffusion area;

b) filling said contact opening with a first conductive filler;

c) removing an upper portion of said conductive filler and a portion of the edges of said conductive cell electrode layer, said removing step continues until the top surface of said first conductive filler is recessed below the bottom surface of said conductive cell electrode layer and said first conductive filler is recessed in from the contact side walls;

d) insulating said conductive cell electrode layer's patterned edges and said top surface of said first conductive filler;

e) removing said insulation from the top surface of said first conductive filler while retaining a major portion of the insulation on said conductive cell electrode layer's patterned edges; and f) refilling said contact opening with a second conductive filler and forming said conductive contact plug therein.

14. The method as recited in claim 13, wherein said first and second insulating materials comprise borophosphosilicate glass.

15. The method as recited in claim 13, wherein the removing step as recited in step "c" comprises an isotropic etch.

16. The method as recited in claim 13, wherein the removing step as recited in step "c" comprises an anisotropic etch followed by an isotropic etch.

17. The method as recited in claim 13, wherein said insulating step comprises oxidation.

18. The method as recited in claim 13, wherein said insulating step comprises insulator deposition of a material selected from the group consisting essentially of silicon dioxide and silicon nitride.

19. The method as recited in claim 13, wherein the removing step as recited in step "e" comprises an anisotropic etch.

20. The method as recited in claim 13, wherein said first and second conductive fillers and said conductive cell electrode comprise materials selected from the group consisting essentially of conductively doped polysilicon, metals and metal silicides.

21. A method for providing capacitor storage cell polysilicon isolation from a polysilicon contact plug in a dynamic random access memory fabrication process, said method comprising the steps of:

a) providing a contact opening through a first borophosphosilicate glass insulating layer, a conductive polysilicon layer, and a second borophosphosilicate glass insulating layer, thereby producing contact side walls and exposing patterned edges of said conductive polysilicon layer and providing access to an underlying diffusion area, said conductive polysilicon layer serving as said capacitor storage cell polysilicon;

b) filling said contact opening with a first conductively doped polysilicon filler;

c) isotropically etching an upper portion of said first conductively doped polysilicon filler and a portion of the edges of said conductive polysilicon layer, said etching step continues until the top surface of said first conductively doped polysilicon filler is recessed below the bottom surface of said conductive polysilicon layer and said conductive layer is recessed in from the contact side walls;

d) oxidizing said conductive polysilicon layer's patterned edges and said top surface of said first conductively doped polysilicon filler;

e) anisotropically etching said oxidation from the top surface of said first conductively doped polysilicon filler while retaining a major portion of the oxidation on said conductive polysilicon layer's patterned edges; and f) refilling said contact opening with a second conductively doped polysilicon filler and forming said conductive polysilicon contact plug therein.

* * * * *